US010866264B2

(12) United States Patent
Tadayon et al.

(10) Patent No.: US 10,866,264 B2
(45) Date of Patent: Dec. 15, 2020

(54) INTERCONNECT STRUCTURE WITH VARYING MODULUS OF ELASTICITY

(71) Applicant: Intel Corporation, Santa Clara, CA (US)

(72) Inventors: Pooya Tadayon, Portland, OR (US); Justin Huttula, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 320 days.

(21) Appl. No.: 15/863,606

(22) Filed: Jan. 5, 2018

(65) Prior Publication Data

US 2019/0212363 A1 Jul. 11, 2019

(51) Int. Cl.
| | | |
|---|---|---|
| *G01R 31/20* | (2006.01) | |
| *G01R 1/067* | (2006.01) | |
| *H05K 1/11* | (2006.01) | |
| *H05K 3/18* | (2006.01) | |
| *H05K 1/09* | (2006.01) | |
| *G01R 1/073* | (2006.01) | |
| *G01R 3/00* | (2006.01) | |

(52) U.S. Cl.
CPC ..... *G01R 1/06755* (2013.01); *G01R 1/06722* (2013.01); *G01R 1/06727* (2013.01); *G01R 1/07314* (2013.01); *G01R 3/00* (2013.01); *H05K 1/09* (2013.01); *H05K 1/118* (2013.01); *H05K 3/188* (2013.01); *G01R 1/06772* (2013.01); *H01L 2224/45144* (2013.01); *H01L 2924/00* (2013.01); *H01L 2924/00014* (2013.01); *H01L 2924/12042* (2013.01); *H05K 2203/0723* (2013.01)

(58) Field of Classification Search
CPC ....... H01L 2924/00; H01L 2924/00014; H01L 2924/12042; H01L 2224/45144; G01R 1/06722; G01R 1/07314; G01R 3/00; G01R 1/06772
USPC ......... 324/71, 378, 403, 415, 425, 500, 537, 324/754.01, 754.03, 754.12, 754.14
See application file for complete search history.

(56) References Cited

U.S. PATENT DOCUMENTS

| | | | |
|---|---|---|---|
| 5,307,560 | A | 5/1994 | Aksu |
| 5,453,701 | A | 9/1995 | Jensen et al. |
| 5,592,222 | A | 1/1997 | Nakamura et al. |
| 6,130,545 | A | 10/2000 | Kiser et al. |

(Continued)

FOREIGN PATENT DOCUMENTS

| | | |
|---|---|---|
| EP | 0962776 | 12/1999 |
| JP | 11-344510 | 12/1999 |

OTHER PUBLICATIONS

Luo, J.K. et al., "Young's modulus of electroplated Ni thin film for MEMS applications", Materials Letters, vol. 58, Issues 17-18, Jul. 2004, pp. 2306-2309.

(Continued)

*Primary Examiner* — Raul J Rios Russo
(74) *Attorney, Agent, or Firm* — Green, Howard & Mughal LLP.

(57) ABSTRACT

An interconnect structure is provided which includes: a member having a first end coupled to a test card, and a second end opposite the first end; and a contact tip at the second end of the member, the contact tip to removably attach to another interconnect structure of a device under test, where a modulus of elasticity of the member varies along a length of the member.

18 Claims, 9 Drawing Sheets

(56) References Cited

U.S. PATENT DOCUMENTS

| | | |
|---|---|---|
| 6,292,004 B1 | 9/2001 | Kocher |
| 6,356,090 B2 | 3/2002 | Deshayes |
| 7,189,077 B1 | 3/2007 | Eldridge et al. |
| 7,436,193 B2 | 10/2008 | Crippen |
| 7,884,632 B2 | 2/2011 | Shiraishi et al. |
| 8,029,291 B2 | 10/2011 | Park |
| 2002/0024347 A1 | 2/2002 | Felici et al. |
| 2002/0163349 A1 | 11/2002 | Wada et al. |
| 2005/0151547 A1 | 7/2005 | Machida et al. |
| 2005/0231855 A1 | 10/2005 | Tran |
| 2006/0151614 A1 | 7/2006 | Nishizawa et al. |
| 2008/0088327 A1 | 4/2008 | Kister |
| 2008/0204061 A1 | 8/2008 | Chartarifsky et al. |
| 2008/0309363 A1 | 12/2008 | Jeon et al. |
| 2009/0219047 A1 | 9/2009 | Peterson et al. |
| 2009/0237099 A1 | 9/2009 | Garabedian et al. |
| 2010/0052715 A1 | 3/2010 | Beaman et al. |
| 2010/0066393 A1* | 3/2010 | Bottoms ............ G01R 1/06711 324/755.05 |
| 2010/0079159 A1* | 4/2010 | Kemmerling ...... G01R 1/07385 324/762.01 |
| 2010/0276572 A1 | 11/2010 | Iwabuchi et al. |
| 2011/0031991 A1 | 2/2011 | Lee et al. |
| 2012/0071037 A1* | 3/2012 | Balucani ............ G01R 1/06716 439/851 |
| 2012/0117799 A1 | 5/2012 | Luo |
| 2012/0319710 A1 | 12/2012 | Dabrowiecki et al. |
| 2013/0002285 A1 | 1/2013 | Nelson et al. |
| 2013/0099812 A1 | 4/2013 | Wang et al. |
| 2013/0200910 A1 | 8/2013 | Ellis-Monaghan et al. |
| 2014/0021976 A1 | 1/2014 | Tanaka |
| 2014/0125372 A1* | 5/2014 | Fukasawa ................ G01R 3/00 324/756.03 |
| 2014/0253162 A1* | 9/2014 | Wang ................ G01R 31/2889 324/754.08 |
| 2014/0347085 A1 | 11/2014 | Kuo et al. |
| 2015/0123693 A1 | 5/2015 | Ota et al. |
| 2015/0192633 A1 | 7/2015 | Garibay et al. |
| 2016/0178663 A1 | 6/2016 | Prabhugoud et al. |
| 2018/0003767 A1 | 1/2018 | Crippa et al. |
| 2019/0212366 A1* | 7/2019 | Tadayon ............ G01R 1/07342 |
| 2020/0025801 A1* | 1/2020 | Tadayon ............ G01R 1/07342 |

OTHER PUBLICATIONS

Darling, K.A. et al., "Mitigating grain growth in binary nanocrystalline alloys through solute selection based on thermodynamic stability maps", Computational Material Science; 84 (2014), 255-266.

Weeden, et al., "Probe Card Tutorial", www.tek.com/keithley, 2003, 40 pages, Keithley Instruments, Inc.

Wikipedia, "Probe Card", last edited on Jul. 29, 2016, 2 pages, Wikipeadia, https://en.wikipedia.org/wiki/probe_card.

* cited by examiner

INTERCONNECT STRUCTURE WITH VARYING MODULUS OF ELASTICITY

BACKGROUND

When designing an interconnect structure such as a test probe, mechanical spring elements may be employed to provide compliance and force to make and maintain reliable contact to a device under test. As the space between the contact points continues to shrink with shrinking size of the device under test, designing an elastic mechanical shape that fits within the pitch constraints of the device under test becomes challenging.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
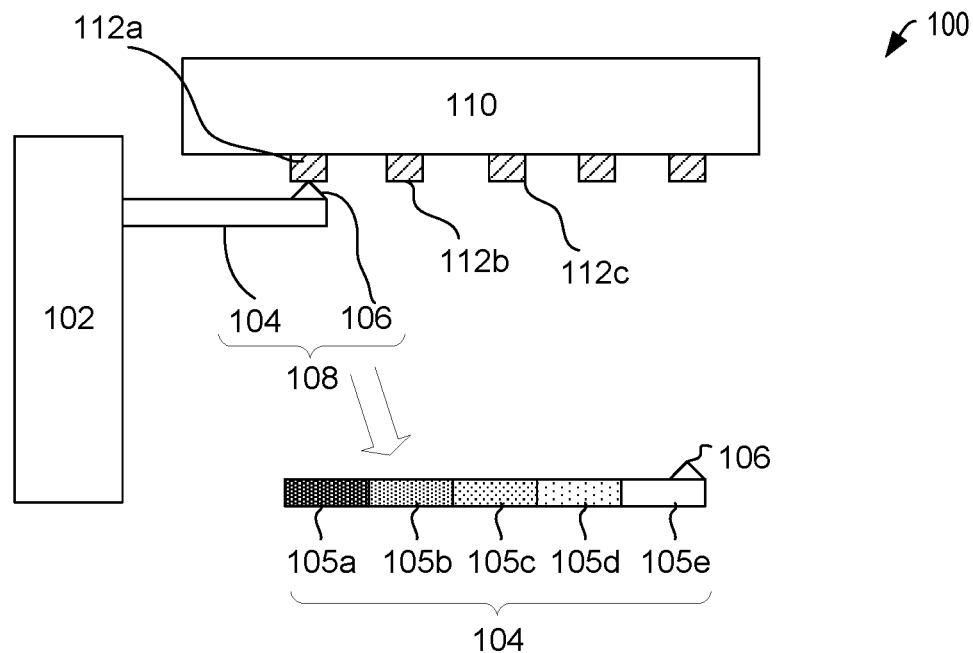
FIG. 1 illustrates a system comprising: a device under test (DUT) and a test probe attached to a test card, where the test probe comprises a member having varying modulus of elasticity along the length of the member (e.g., to increase a maximum deflection of the member), according to some embodiments.

A testing arrangement may be used to test one or more devices under test (DUTs). A DUT may be an integrated circuit (IC) package, for example. For example, a test probe (e.g., a temporary interconnect structure) of the testing arrangement may make contact with an interconnect structure of the DUT, when the DUT is to be tested by the testing arrangement.

In an example, the test probe may conduct current between the testing arrangement and the DUT. To ensure firm and good contact between the test probe and the interconnect structure of the DUT, the test probe may have spring like properties. For example, the test probe (e.g., a tip of the test probe) may deflect when force is applied to the test probe, e.g., to make firm contact between the test probe and the interconnect structure of the DUT.

In some embodiments, for better deflection of the tip of the test probe while maintaining adequate mechanical strength of the test probe, a modulus of material E of the test probe is varied along a length of the test probe. For example, a base of the test probe may have higher modulus of material E, thereby providing adequate mechanical strength to the test probe. The tip of the test probe may have lower modulus of material E, thereby providing necessary deflection of the test probe. For example, the modulus of material E may monotonically reduce from the base to the tip of the test probe, thereby providing better deflection of the tip of the test probe while maintaining adequate mechanical strength of the test probe. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a system 100 comprising: a device under test (DUT) 110 and a test probe 108 attached to a test card 102, where the test probe 108 comprises a member 104 having varying modulus of elasticity along a length of the member 104 (e.g., to increase a maximum deflection of the member 104), according to some embodiments. In some embodiments, the DUT 110 may be any appropriate integrated circuit (IC), an IC package, a System on a Chip (SOC), and/or another appropriate component.

In some embodiments, the DUT 110 may comprise a plurality of interconnect structures 112a, 112b, 112c, and so on. Individual interconnect structures 112 may comprise, for example, metal pillars, bumps, bump pads, balls formed using metals, alloys, solderable material, and/or the like. Elements referred to herein with a common reference label followed by a particular number or alphabet may be collectively referred to by the reference label alone. For example, interconnect structures 112a, 112b, 112c, etc. may be collectively and generally referred to as interconnect structures 112 in plural, and interconnect structure 112 in singular.

In some embodiments, the test card 102 may be coupled to a testing apparatus (not illustrated in FIG. 1). The testing apparatus and/or the test card 102 may be configured to test a plurality of devices, e.g., including the DUT 110.

In some embodiments, a plurality of test probes is attached to the test card 102, although only one such test probe 108 is illustrated in FIG. 1 for purposes of illustrative clarity. In an example, individual test probes (e.g., the test probe 108) are temporarily attached (e.g., removably attached) to corresponding interconnect structures 112 of the DUT 110. For example, when the DUT 110 is to be tested, the test probe 108 is attached to the interconnect structure 112a of the DUT 110. After the testing of the DUT 110 is complete, another device replaces the DUT 110, and the test probe 108 is again attached to another interconnect structure of the another device. Thus, multiple devices may be tested, e.g., one after another, by the test card 102.

In an example, the test probes of the test card 102, including the test probe 108, are interconnect structures of the test card 102 (e.g., which may be temporarily and removably attached to the interconnect structures of devices under test). Thus, the test probes of the test card 102, including the test probe 108, are also referred to herein as temporary interconnect structures (or test pins) of the test card 102. Various embodiments and examples discuss the test probe 108. However, such discussion may also apply to other test probes of the test card 102 as well (although the other test probes are not illustrated in FIG. 1).

In some embodiments, the test probe 108 may comprise a member 104, and a contact point or contact tip 106. The member 104 and the contact point 106 may transmit current between the test card 102 and the interconnect structure 112a of the DUT 110, e.g., when the DUT 110 is being tested. The member 104 may include a first end attached to the test card 102, where the first end may also be referred to herein as a base of the member 104. The member 104 may also include a second end on which the contact point 106 is located, where the second end may also be referred to herein as a tip of the member 104.

FIG. 1 also illustrates a detailed view of the test probe 108, including the member 104 and the contact point 106. As illustrated in FIG. 1, in some embodiments, the member 104 comprises a plurality of sections, e.g., sections 105a, 105b, 105c 105d, and 105e (also generally referred to as sections 105 in plural, and section 105 in singular). The section 105a at an end of the member 104 (e.g., at the base of the member 104) may be attached or coupled to the test card 102, while the section 105e at another end of the member 104 (e.g., at the tip of the member 104) may include the contact point 106 for contact with the interconnect structure 112a of the DUT 110. The sections 105b, 105c, and 105d may be between the two end sections 105a and 105e.

In some embodiments, a modulus of material E (e.g., which may be the Young's modules, modulus of elasticity, elastic modulus, and/or the like) of the member 104 varies along a length of the member 104. The modulus of material E may be a measure of the stiffness of a solid material. For example, it is a mechanical property of linear elastic solid material, and defines a relationship between stress (force per unit area) and strain (proportional deformation) in a material.

For example, each of the sections 105a, . . . , 105e of the member may have corresponding values of the modulus of material E, which may be different. For example, the section 105a may have a first value of the modulus of material E, the section 105b may have a second value of the modulus of material E, the section 105c may have a third value of the modulus of material E, the section 105d may have a fourth value of the modulus of material E, and the section 105e may have a fifth value of the modulus of material E, where the first, second, third, fourth and fifth values may be different from each other. Merely as an example, the first value of the section 105a may be higher than the second value of the section 105b, the second value of the section 105b may be higher than the third value of the section 105c, the third value of the section 105c may be higher than the fourth value of the section 105d, and the fourth value of the section 105d may be higher than the fifth value of the section 105e.

Thus, the modulus of material E may decrease (e.g., monotonically decrease) from the base to the tip of the member 104, e.g., along the length of the member 104. For example, assume any two points along the length of the member 104, with a first point of the two points nearer to the base of the member 104 than a second point of the two points. As the modulus of material E monotonically decreases from the base to the tip of the member 104, the modulus of material E of the first point is greater than, or equal to, the modulus of material E of the second point.

Although FIG. 1 illustrates five sections of the member 104, in other examples, the member 104 may include more or less number of sections (e.g., two sections, three sections, four sections, six sections, or even higher number of sections). Although FIG. 1 illustrates variation of the modulus of material E in five steps (e.g., corresponding to the five sections 105a, . . . , 105e), the variation of the modulus of material may be continuous or near continuous (e.g., uniform or linear along the length), e.g., which may result in a larger number of sections 105. Composition of the member 104 and ways to vary the modulus of material E have been discussed in detail herein later.

Figure 2:
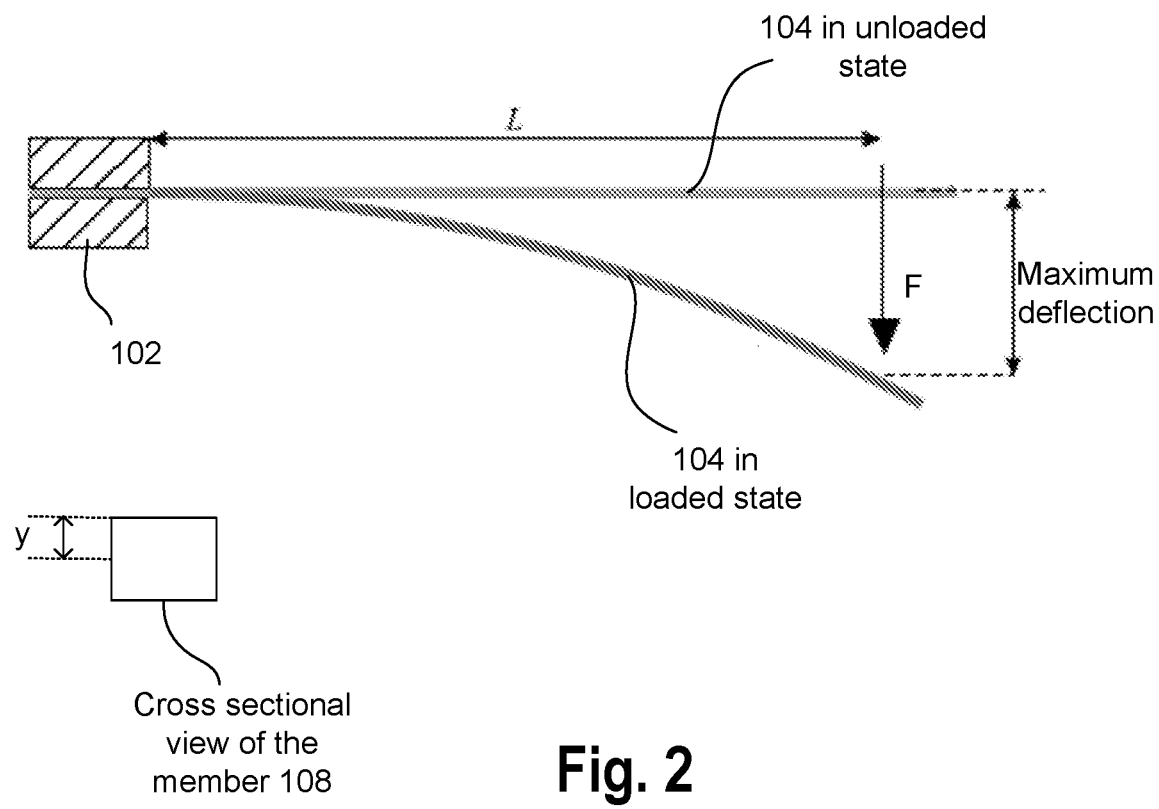
FIG. 2 illustrates the member of the test probe in an unloaded state and a loaded state, and also illustrates a cross-sectional view of the member, according to some embodiments.

FIG. 2 illustrates the member 104 of the test probe 108 in an unloaded state and a loaded state, and also illustrates a cross-sectional view of the member 104, according to some embodiments. The member 104 in FIG. 2 is illustrated schematically using two solid lines—one for an unloaded state (e.g., when no force is being applied), and another for a loaded state (e.g., when a force F is being applied). The sections 105 of the member 104 are not separately illustrated in FIG. 2.

In an example, the force F may be applied substantially perpendicular to the member 104, e.g., at or near an end or tip of the member 104 on which the contact point 106 is located (although the contact point 106 is not illustrated in FIG. 2). Application of the force F results in deflection of the member 104, where the maximum deflection occurs in the tip of the member 104. Let a length of the member 104 be L. Let y (illustrated in the cross-sectional view) be a distance from a cross sectional edge of the tip from neutral axis (e.g., y may be half the height of the member 104 at the tip).

In the example of FIG. 2, the member 104 is assumed to have modulus of material E. In one example, it may be assumed (merely for purposes of explaining the principles of this disclosure) that the member 104 has a uniform modulus of material E. In another example, it may be assumed that the member 104 has an average modulus of material of E. In an example, the member 104 is assumed to have a second moment of area I, which may be a function of cross-sectional geometry.

In an example, the member 104 may be similar to a cantilever beam, in which force may be applied to achieve deflection at various points of the beam. As is well known to those skilled in the art, in a cantilever beam, such as the member 104, the maximum deflection (e.g., deflection at the tip of the member 104) is given by:

$$\text{Maximum Deflection} = -\frac{\text{Force } F * \text{Length } L}{3 * E * I}. \quad \text{Equation 1}$$

Additionally, the maximum force that may be applied to a cantilever beam style member, such as the test probe 108, may be limited by a maximum stress that can be applied to the material before exceeding the material limits, e.g., thereby causing plastic deformation.

$$\text{Maximum Stress} = \frac{\text{Force } F * \text{Length } L * y}{I}. \quad \text{Equation 2}$$

Referring again to FIGS. 1-2, in some embodiments, it may be desired to have deflection of the member 104, where the maximum deflection may be desired at the tip of the member 104. The deflection at the tip of the member 104 may also be referred to as Over-Travel (OT) of the test probe 108. For example, such OT of the test probe 108 may be useful when the test probe 108 is to contact the interconnect structure 112a. For example, a force (e.g., force F of FIG. 2) may be applied to the test probe 108 to make firm contact with the interconnect structure 112a, and the test probe 108 absorbs the force by deflecting. Thus, the deflection or OT may be a desired or useful property of the test probe 108. In some embodiments, it may be useful to have relatively large value of the maximum deflection (e.g., deflection at the tip of the member 104) of the test probe 108.

Referring again to equations 1 and 2, it may be observed that the maximum deflection may be increased by increasing the force. However, there may be a limitation to the amount of applied force, as seen from equation 2. The length L of the member 104 may be increased to increase the maximum deflection—however, the length L may be based on many other factors, such as pitch of the interconnect structures 112 of the DUT 110, available area for fitting all the test probes, size of the test card 102, etc. The cross-sectional half width y and/or the second moment of area I may also be varied to increase the maximum deflection. However, for that, the cross section of the member 104 may have to be tightly controlled, which may not be desirable in some situations.

In some embodiments, the maximum deflection can be increased by, for example, reducing the modulus of material E. For example, the modulus of material E may be modified across a length of the member 104, e.g., to increase the deflection at the tip of the member 104. From equations 1 and 2, reducing the modulus of material E from the base of the member 104 to the tip of the member 104 may increase an overall displacement of the tip of the member 104, while maintaining any force and/or material limit constraints of the member 104. Thus, as discussed with respect to FIG. 1, the member 104 may be partitioned in multiple sections, with varying modulus of material E for each section. For example, the higher modulus of material E at the base of the member 104 may provide mechanical strength to the member 104, while the lower modulus of material E at the tip of the member 104 may provide higher deflection at the tip of the member 104.

Figure 3:
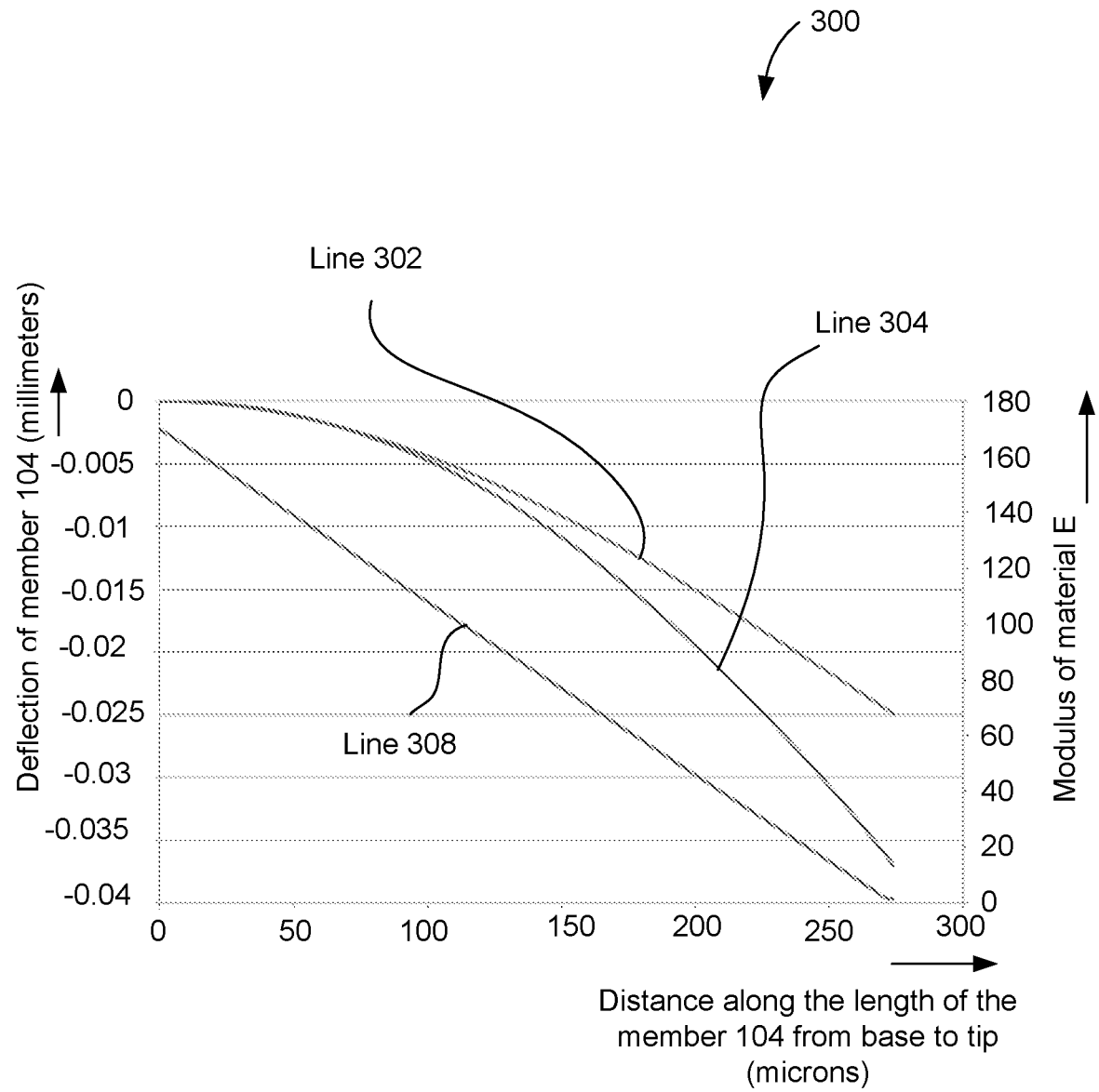
FIG. 3 is a graph illustrating effects of linear variation of modulus of material E along the length of the member of the test probe on the deflection of the member, according to some embodiments.

FIG. 3 is a graph 300 illustrating effects of linear variation of modulus of material E along the length of the member 104 of the test probe 108 on the deflection of the member 104, according to some embodiments. The X axis of the graph 300 depicts distance along the length of the member 104, from the base to the tip (e.g., in microns or um). Merely as an example, a first end or base of the member 104 touching the test card 102 has the distance of 0 um, and a second end of the member 104 on the tip has the distance of slightly less than 300 um. The graph 300 has two Y axes. The Y axis on the left depicts the deflection of the member 104 and measured in millimeters. The Y axis on the right depicts variation of modulus of material E and measured in Gigapascals (GPa). The numerical values in the graph 300 are merely examples, and do not limit the scope of this disclosure.

The graph 300 comprises a line 302, which represents variation of deflection of the member 104, assuming homogenous or constant (or about constant) modulus of material E along the length of the member 104 (note that such a homogenous modulus of material E along the length of the member 104 is not illustrated in FIG. 1). The graph 300 comprises another line 304, which represents variation of deflection of the member 104, assuming variation in the modulus of material E along the length of the member 104 in accordance with line 308. Lastly, the graph 300 includes the line 308 depicting an example linear or continuous variation in the modulus of material E along the length of the member 104.

Thus, the lines 302 and 304 use the Y axis on the left side of the graph 300, and the line 308 uses the Y axis on the right side of the graph 300. It is to be noted that the line 308 illustrates a continuous or linear variation of the modulus of material E along the length of the member 104, whereas the member 104 is illustrated to have stepwise variation in FIG. 1.

In an example, as depicted by the line 302, with constant or near constant modulus of material E, the deflection at the tip of the member 104 is about 0.025 millimeters. On the other hand, as depicted by the line 304, with linear variation of the modulus of material E, the deflection at the tip of the member 104 is between 0.035 to 0.04 millimeters. Thus, if the modulus of the material E is reduced linearly with the length of the member 104 (e.g., in accordance with the line 308), an increase in deflection of about 50% or more can be realized at the tip of the member 104 (e.g., compared to the scenario with constant modulus of material).

Figure 4:
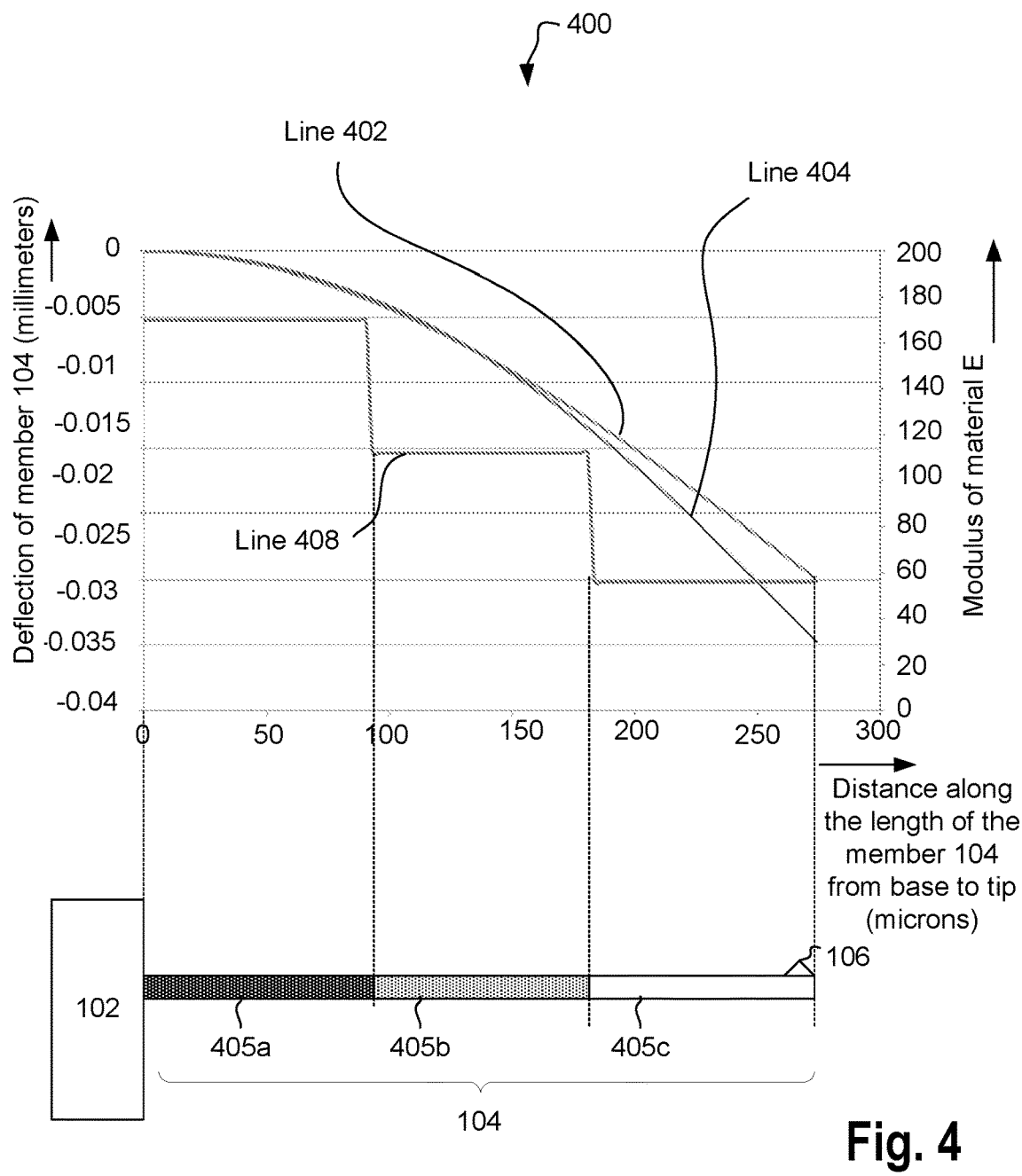
FIG. 4 is a graph illustrating effects of step-wise variation of modulus of material E along the length of the member of the test probe on the deflection of the member, according to some embodiments.

In practice, in some examples, the modulus of the material E of the member 104 may be varied in steps along the length of the member 104 (e.g., as discussed with respect to FIG. 1), e.g., instead of the linear variation discussed with respect to FIG. 3. For example, FIG. 4 is a graph 400 illustrating effects of step-wise variation of modulus of material E along the length of the member 104 of the test probe 108 on the deflection of the member 104, according to some embodiments. The graph 400 is at least in part similar to the graph 300 of FIG. 3. For example, the X axis of the graph 400 depicts distance along the length of the member 104, from the base to the tip. The Y axis on the left depicts the deflection of the member 104 in millimeters. The Y axis on the right depicts variation of modulus of material E in GPa. The numerical values in the graph 400 are merely examples, and do not limit the scope of this disclosure.

The graph 400 comprises a line 402, which represents variation of deflection of the member 104, assuming homogenous or constant (or about constant) modulus of material E along the length of the member 104 (note that such a homogenous modulus of material E along the length of the member 104 is not illustrated in FIG. 1). The graph 400 comprises another line 404, which represents variation of deflection of the member 104, assuming step-wise variation (e.g., in accordance with line 408) in the modulus of material E along the length of the member 104. Lastly, the graph 400 includes the line 408 depicting the step-wise variation in the modulus of material E along the length of the member 104. In the example of FIG. 4, the line 408 assumes variation of the modulus of material E in three steps.

FIG. 4 also illustrates another example implementation of the member 104, where the member 104 comprises three sections 405a, 405b, and 405c. Each section 405 of the member 104 corresponds to a respective step of the three steps of the line 408. For example, the first section 405a has a modulus of material E of slightly over 160, as illustrated from the line 408. The second section 405b has a modulus of material E of slightly under 120. The third section 405c has a modulus of material E of slightly under 60.

In an example, as depicted by the line 402, with constant or near constant modulus of material E, the deflection at the tip of the member 104 is about 0.03 millimeters. On the other hand, as depicted by the line 404, with step-wise variation of the modulus of material E along the length of the member 104, the deflection at the tip of the member 104 is about 0.035 millimeters. Thus, if the modulus of the material E is reduced step-wise (e.g., in about three steps) along the length of the member 104, an increase in deflection of about 20% can be realized at the tip of the member 104 (e.g., compared to the scenario with constant modulus of material).

Although FIG. 4 illustrates variations of the modulus of material in three steps, more or less steps may be used as well. The higher modulus of material E at the base of the member 104 may provide mechanical strength to the member 104, while the lower modulus of material E at the tip of the member 104 may provide higher deflection at the tip of the member 104.

Figure 5:
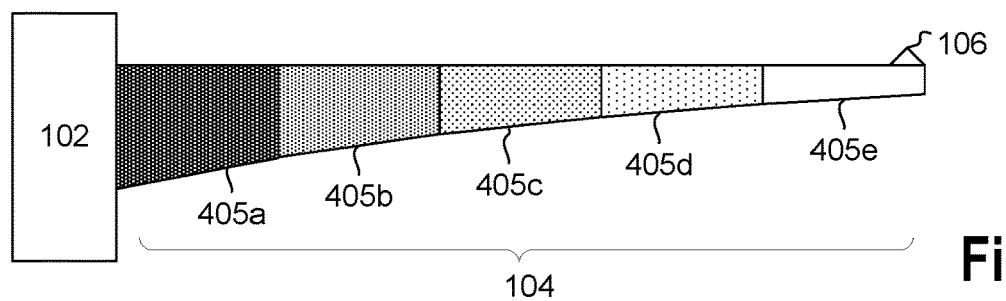
FIG. 5 illustrates an example structure of the member of the test probe of the system of FIG. 1, according to some embodiments.

FIG. 5 illustrates another example structure of the member 104 of the test probe 108 of the system 100 of FIG. 1, according to some embodiments. In the embodiment of FIG. 5, the member 104 includes five sections 405a, 405b, 405c, 405d, and 405e. In an example, the modulus of material E of these sections vary in a manner similar to the sections 105a, . . . , 105e of FIG. 1 (e.g., section 405a has higher modulus of material than section 405b, section 405b has higher modulus of material than section 405c, and so on).

However, unlike the sections 105a, . . . , 105e of FIG. 1, in some embodiments, the sections 405a, . . . , 405e are tapered. For example, a cross-sectional area of the section 405a is higher than that of the section 405b, the cross-sectional area of the section 405b is higher than that of the section 405c, and so on, as illustrated in FIG. 5.

Although FIG. 5 illustrates a gradual or linear tapering of the sections, in some other embodiments (and not illustrated in the figure), the tapering may be step wise. For example, the cross-sectional area of any section 405 may be substantially same throughout the length of that section—but a section near the base would have higher cross sectional area than an immediate adjacent section towards the tip of the member 104.

As discussed with respect to equations 1 and 2, the cross-section of the member 104 can be modified across its length to increase the deflection at the tip. For example, reducing the cross-section along the length may reduce the second moment area (I) term in equations 1 and 2, thus increasing the overall displacement of the tip, while maintaining the force and material limit constraints of the member 104. In an example, the combination of the tapered sections and variation of the modulus of material E may have higher impact on the increase in the deflection (e.g., compared to merely having tapered sections but with homogenous modulus of material E, or compared to merely having varying modulus of material E but with constant cross-sectional area).

In an example, the member 104 may be formed using an electroplating process. In an example, the modulus of material E and/or the yield stress of electroplated material may be modified by adjusting one or more parameters associated with the electroplating process.

Figure 6A:
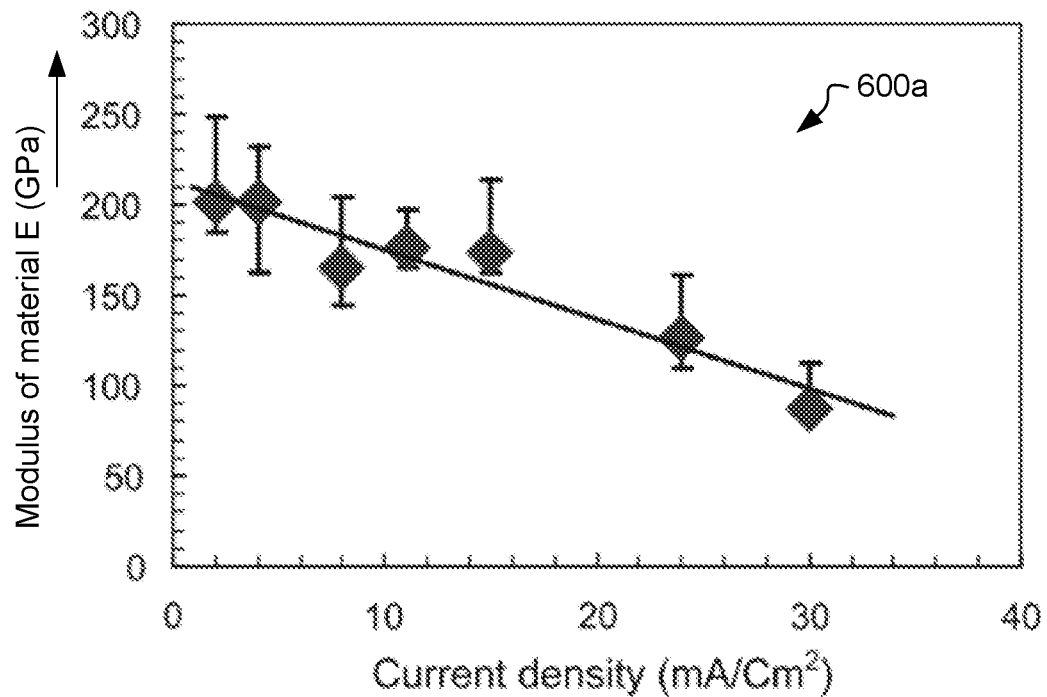
FIG. 6A illustrates a graph depicting a variation of modulus of material E of components formed by electroplating process, when a current density during the electroplating process is varied.

FIG. 6A illustrates a graph 600a depicting a variation of modulus of material E of components formed by electroplating process, when a current density during the electroplating process is varied. The X axis of the graph 600a represents variation of the current density, measured in milliampers/square centimeter (mA/cm$^2$). The Y axis represents the resulting variation of the modulus of material E, measured in GPa. In an example, the electroplating process may be carried out at temperature 60° C., and the material may be Nickel (e.g., thin film of Nickel). As seen, with an increase in the current density during the electrodeposition process, the modulus of material E decreases (e.g., about linearly).

Figure 6B:
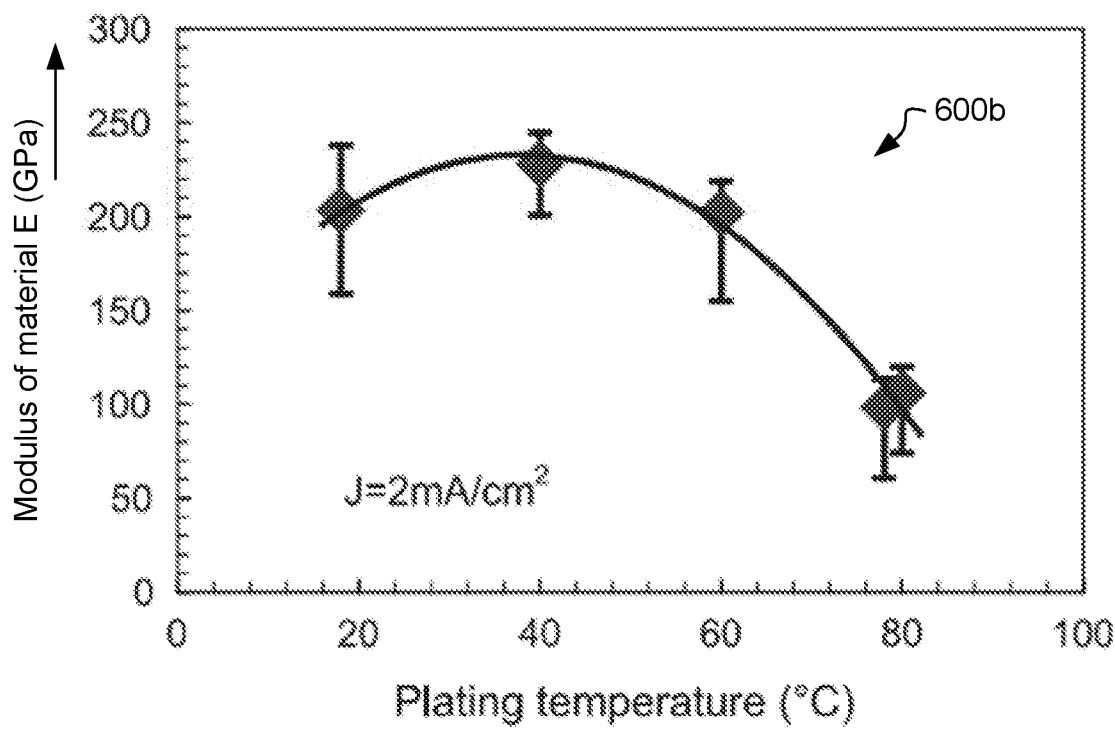
FIG. 6B illustrates a graph depicting a variation of modulus of material E of components formed by electroplating process, when a temperature during the electroplating process is varied.

FIG. 6B illustrates a graph 600b depicting a variation of modulus of material E of components formed by electroplating process, when a temperature during the electroplating process is varied. The X axis of the graph 600a represents variation of the temperature, measured in degree Centigrade. The Y axis represents the resulting variation of the modulus of material E, measured in GPa. In an example, the electroplating process may be carried out at current density of 2 mA/cm$^2$, and the material may be Nickel (e.g., thin film of Nickel). As seen, the modulus of material E is a function of the temperature during the electroplating process.

Although FIGS. 6A-6B illustrate the modulus of material E of a material being functions of two parameters of the electroplating process for forming the material, the modulus of material E may be a function of any other parameter(s) associated with the electroplating process for forming the material.

Figure 7:
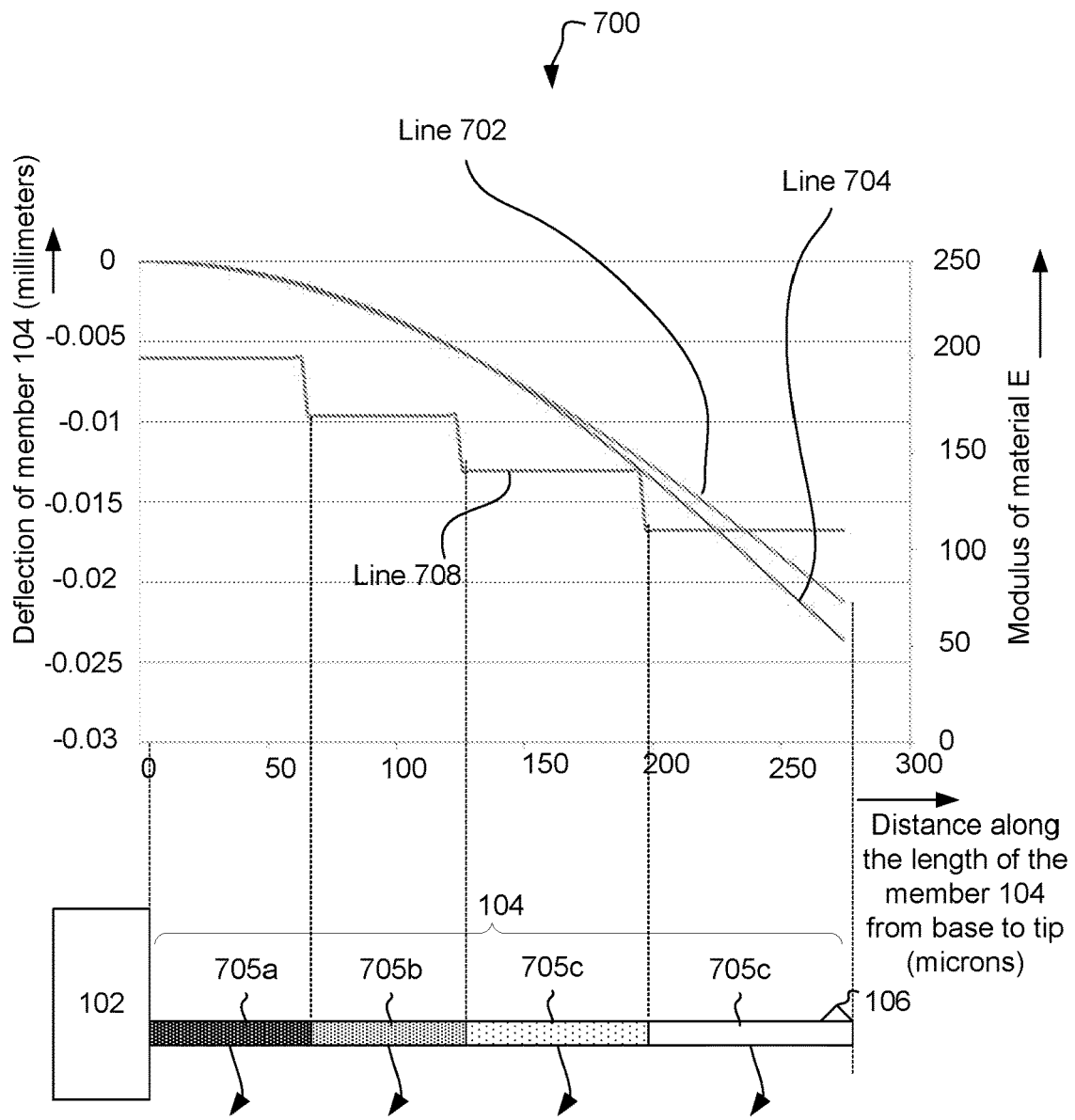
FIG. 7 illustrates a graph depicting effects of step-wise variation of modulus of material E along a length of the member of the test probe on the deflection of the member, and also illustrates a table depicting example variation in current density during an electroplating process that results in the step-wise variation of the modulus of material E, according to some embodiments.

FIG. 7 illustrates a graph 700 depicting effects of step-wise variation of modulus of material E along a length of the member 104 of the test probe 108 on the deflection of the member 104, and also illustrates a table 750 depicting example variation in current density during an electroplating process that results in the step-wise variation of the modulus of material E, according to some embodiments. The graph 700 is at least in part similar to the graph 300 of FIG. 3. For example, the X axis of the graph 700 depicts distance along the length of the member 104, from the base to the tip. The Y axis on the left depicts the deflection of the member 104 in millimeters. The Y axis on the right depicts variation of the modulus of material E in GPa. The numerical values in the graph 700 are merely examples, and do not limit the scope of this disclosure.

The graph 700 comprises a line 702, which represents variation of deflection of the member 104, assuming homogenous or constant (or about constant) modulus of material E along the length of the member 104. The graph 700 comprises another line 704, which represents variation of deflection of the member 104, assuming step-wise variation in the modulus of material E along the length of the member 104 in accordance with line 708. Lastly, the graph 400 includes the line 708 depicting an example step-wise variation in the modulus of material E along the length of the member 104.

Thus, the line 708 illustrates a stepwise variation of the modulus of material E along the length of the member 104. In the example of FIG. 7, the line 708 assumes variation of the modulus of material E in four steps.

FIG. 7 also illustrates another example implementation of the member 104, where the member 104 comprises four sections 705a, 705b, 705c, and 705d. Each section 705 of the member 104 corresponds to a respective step of the four steps of the line 708. The table 750 indicates a plating current density (e.g., in mA/cm$^2$) used to form each of the sections 705 during the electroplating process to form the member 104. The table 750 also indicates the resultant modulus of material E for each of the sections 705. The table 750 also indicates a type of material used to form the various sections 705.

For example, the first section 705a has a modulus of material E of about 200 GPa, as illustrated from the line 708 and from the table 750. Also, the plating current density to form the section 705a is about 5 mA/cm$^2$.

The second section 705b has a modulus of material E of about 170 GPa. Also, the plating current density to form the section 705b is about 12 mA/cm$^2$.

The third section 705c has a modulus of material E of about 140 GPa. Also, the plating current density to form the section 705c is about 20 mA/cm$^2$.

The fourth section 705d has a modulus of material E of about 110 GPa. Also, the plating current density to form the section 705d is about 30 mA/cm$^2$.

As also indicated by the table 750, a same material 740 may be used to form all the sections 705a, . . . , 705d. The material 740 may be, for example, nickel, copper, silver, an appropriate metal, and/or an appropriate conductive material. Thus, the material is homogenous along the length of the member 104.

In an example, as depicted by the line 702, with constant or near constant modulus of material E, the deflection at the tip of the member 104 is slightly over 0.02 millimeters. On the other hand, as depicted by the line 704, with the step-wise variation of the modulus of material E along the length of the member 104, the deflection at the tip of the member 104 is about 0.25 millimeters. Thus, if the modulus of the material E is reduced step-wise (e.g., in about four steps) with the length of the member 104, an increase in deflection of about 10% can be realized at the tip of the member 104 (e.g., compared to the scenario with constant modulus of material).

In the example of FIG. 7, it is assumed that all the four sections 705a, . . . 705d are formed using the same material 740. The stepwise variation in the modulus of material E is achieved by varying the plating current density to form the various sections of the member 104. For example, the monotonic increase in the plating current density along the length of the member 104 (e.g., from the base to the tip), while forming the member 104, may result in the corresponding monotonic decrease in the modulus of material E along the length of the member 104 (e.g., from the base to the tip). Varying the plating current density during the electrodeposition process may vary the crystallographic structure or state of the material 740 along the length of the member 104, thereby varying the modulus of material E along the length of the member 104.

Although four distinct sections of the member 104 (and four corresponding steps of the modulus of material E) are discussed with respect to FIG. 7, in some examples, the variation of the modulus of material E may be more linear or continuous along the length of the member 104. For example, the increase in the plating current density may be somewhat continuous or linear along the length of the member 104, to result in the variation of the modulus of material E to be somewhat linear or continuous along the length of the member 104 (e.g., instead of being in four distinct steps).

In FIG. 7, the modulus of material E is varied by varying a parameter of the electroplating process to form the member 104 (e.g., by varying the electroplating current density). In some other embodiments, one or more other parameters (e.g., temperature) of the electroplating process may also be varied (e.g., instead of, or in addition to, varying the electroplating current density) to achieved variation of the modulus of material E along the length of the member 104.

Figure 8:
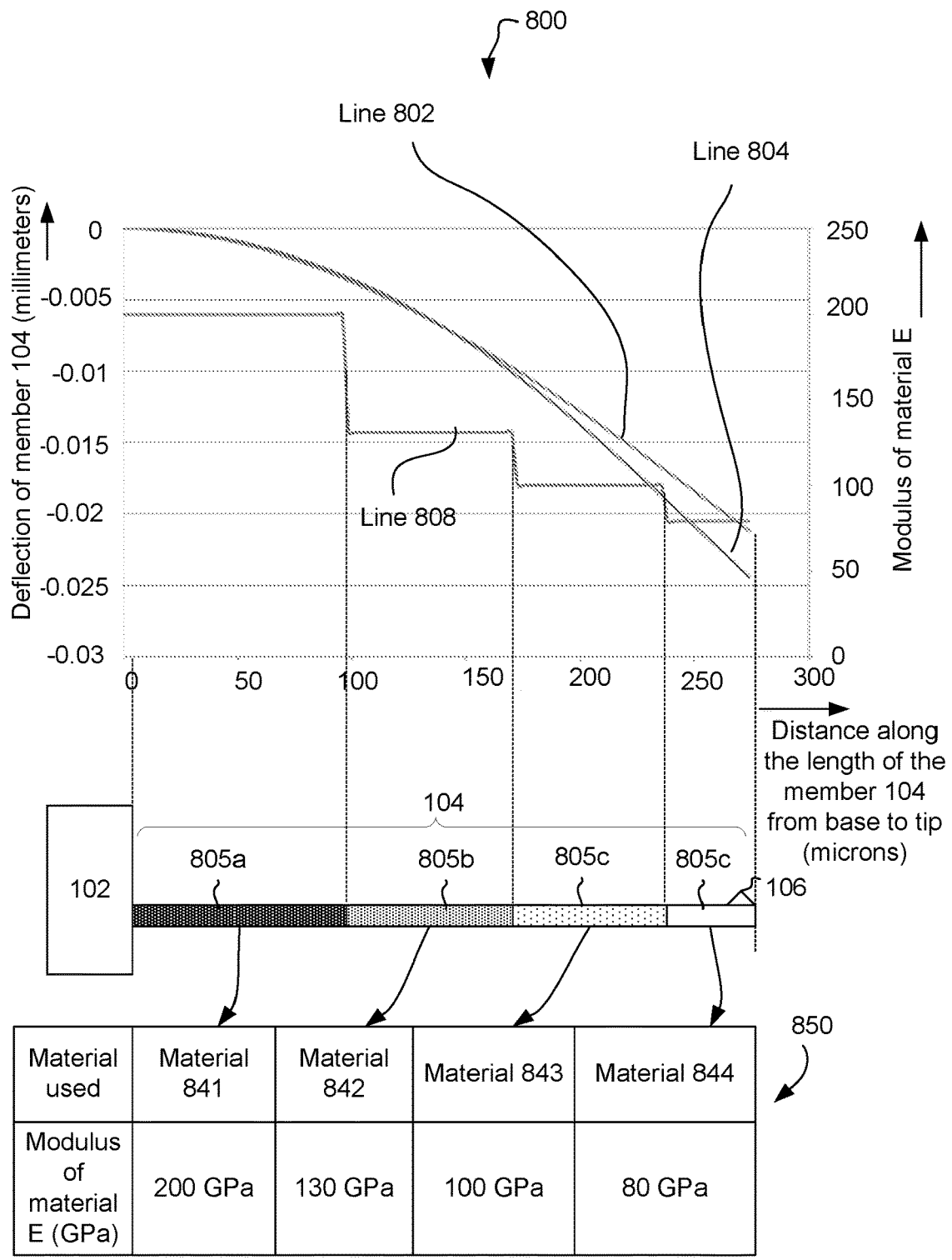
FIG. 8 illustrates a graph depicting effects of step-wise variation of modulus of material E along the length of the member of the test probe on the deflection of the member, and also illustrates a table depicting example variation in the material used to form the member that results in the step-wise variation of the modulus of material E, according to some embodiments.

Furthermore, in some embodiments, different material may be used to form different sections of the member 104, which may result in corresponding variation of the modulus of material E. For example, FIG. 8 illustrates a graph 800 depicting effects of step-wise variation of modulus of material E along the length of the member 104 of the test probe 108 on the deflection of the member 104, and also illustrates a table 750 depicting example variation in the material used to form the member 104 that results in the step-wise variation of the modulus of material E, according to some embodiments. The graph 800 is at least in part similar to the graph 300 of FIG. 3. For example, the X axis of the graph 800 depicts distance along the length of the member 104, from the base to the tip. The Y axis on the left depicts the deflection of the member 104 in millimeters. The Y axis on the right depicts variation of the modulus of material E in GPa. The numerical values in the graph 900 are merely examples, and do not limit the scope of this disclosure.

The graph 800 comprises a line 802, which represents variation of deflection of the member 104, assuming homogenous or constant (or about constant) modulus of material E along the length of the member 104. The graph 800 comprises another line 804, which represents variation of deflection of the member 104, assuming step-wise variation in the modulus of material E along the length of the member 104 in accordance with line 808. Lastly, the graph 800 includes the line 808 depicting an example step-wise variation (e.g., in four steps) in the modulus of material E along the length of the member 104.

FIG. 8 also illustrates another example implementation of the member 104, where the member 104 comprises four sections 805a, 805b, 805c, and 805d. Each section 805 of the member 104 corresponds to a respective step of the four steps of the line 808. The table 850 indicates a type of material used to form a corresponding section of the member 104. The table 850 also indicates the resultant modulus of material E for each of the sections 805.

For example, the first section 805a has a modulus of material E of about 200 GPa, as illustrated from the line 808 and from the table 850. Also, material 841 is used to form the section 805a.

The second section 805b has a modulus of material E of about 130 GPa. Also, material 842 is used to form the section 805b.

The third section 805c has a modulus of material E of about 100 GPa. Also, material 843 is used to form the section 805c.

The fourth section 805d has a modulus of material E of about 80 GPa. Also, material 844 is used to form the section 805d.

In an example, the materials 841, 842, 843, and 844 may be different materials. In an example, at least two of the materials 841, 842, 843, and 844 may be same material, but with different structure and/or crystallographic structure or state. As illustrated in the table 850, the material 841 has a higher modulus of material E than material 842, the material 842 has a higher modulus of material E than material 843, and so on.

Any appropriate materials (e.g., conductive materials with varying degrees of modulus of material E) may be selected for the materials 841, . . . , 844. Merely as an example, the material 841 may be Nickel, the material 842 may be Copper in a first crystallographic state, the material 843 may be Copper in a second crystallographic state, and the material 844 may be Silver. Thus, the base of the member 104 may be plated from a relatively higher strength Nickel material, with modulated Copper in between, and finally capped with a relatively soft material such as Silver at the tip. For example, the higher strength Nickel material 841 at the base of the member 104 may provide mechanical strength to the member 104, while the relatively soft Silver material 844 at the tip of the member 104 may provide higher deflection at the tip of the member 104.

In an example, as depicted by the line 802, with constant or near constant modulus of material E, the deflection at the tip of the member 104 is slightly under 0.02 millimeters. On the other hand, as depicted by the line 804, with the step-wise variation of the modulus of material E along the length of the member 104, the deflection at the tip of the member 104 is about 0.25 millimeters. Thus, if the modulus of the material E is reduced step-wise (e.g., in about four steps) with the length of the member 104 by varying the material along the length of the member 104, an increase in deflection of about 15-20% can be realized at the tip of the member 104 (e.g., compared to the scenario with constant modulus of material).

Figure 9A:
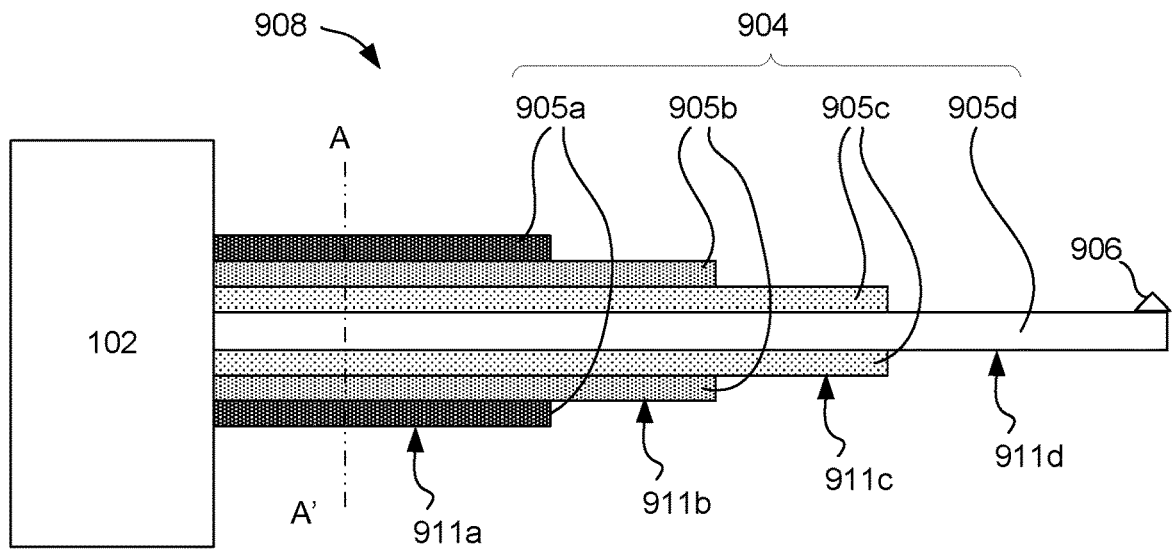
FIGS. 9A-9D illustrate another example structure of a member of a test probe, according to some embodiments.
Figure 9B:
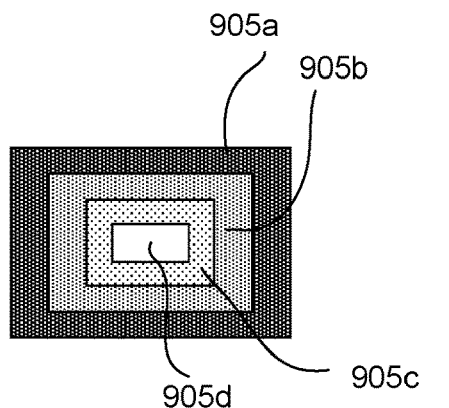
Figure 9C:
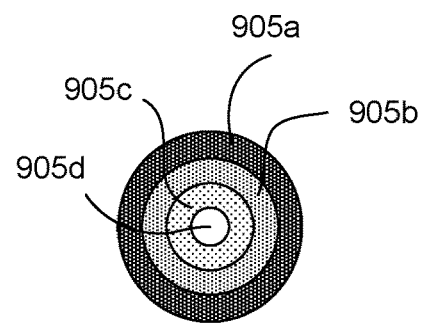
Figure 9D:
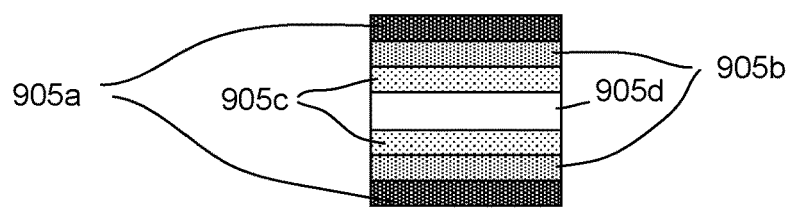

FIG. 9A illustrates another example structure of a member 904 of a test probe 908, according to some embodiments. FIG. 9A is a cross sectional view of the test probe 908, when viewed from a side. FIGS. 9B-9D illustrate example cross sectional views of the test probe along the line A-A' of FIG. 9A (e.g., when view from the tip of the member 904).

In the embodiment of FIGS. 9A-9D, the member 904 includes a core 905d running from the test card 102 to a contact tip 906 of the member 904. Various layers of material 905c, 905b, and 905a may be deposited on the core 905d.

In some embodiments, the modulus of material E of the core 905d is lowest among the components 905a, . . . , 905d. In some embodiments, the modulus of material E of the layer 905c is higher than that of the core 905d. In some embodiments, the modulus of material E of the layer 905b is higher than that of the layer 905c. In some embodiments, the modulus of material E of the layer 905a is higher than that of the layer 905a. Thus, the modulus of material E of the member 904 increases from inside radially towards outside. Merely as an example, the material of the layer 905a may be Nickel, the material of the layer 905b may be Copper in a first crystallographic state, the material of the layer 905c may be Copper in a second crystallographic state, and the material of the core 905d may be Silver. In some embodiments, at least the core 905d may comprise conductive material, such as a metal, a metal alloy, and/or the like.

As illustrated in FIG. 9A, merely the core 905d may extend all the way from the base to the contact tip 906. The length of the layer 905c may be shorter than the length of the core 905d; the length of the layer 905b may be shorter than the length of the layer 905c; and the length of the layer 905a may be shorter than the length of the layer 905b.

In some embodiments, the layers 905 905a, 905b, 905c and the core 905 may be arranged in two dimensional stacks, e.g., as illustrated in FIG. 9D. In some embodiments, the layers 905 905a, 905b, 905c and the core 905 may be arranged in concentric circles, e.g., as illustrated in FIG. 9C. In some embodiments, the layers 905 905a, 905b, 905c and the core 905 may be arranged in concentric rectangles, e.g., as illustrated in FIG. 9B.

In some embodiments, because of the difference in the modulus of material E and the length of the various layers 905a, 905b, 905c and the core 905d, an average modulus of material E may vary across a length of the member 905. For example, an average modulus of material E at a point 911a along the length of the member 905 may be higher than an average modulus of material E at a point 911b. Similarly, the average modulus of material E at the point 911b along the length of the member 905 may be higher than an average modulus of material E at a point 911c. Also, the average modulus of material E at the point 911c along the length of the member 905 may be higher than an average modulus of material E at a point 911d.

In an example, the relatively higher modulus of material E of the layers 905a, 905b, 905c provide higher mechanical strength at and near the base of the member 904. Also, the relatively lower modulus of material E of the core 905d at and near the contact tip 906 provides higher deflection capability at the tip of the member 904.

Some examples associated with FIGS. 1-9D assume that the test probes are attached to a test card. However, in some examples, the test probes may be attached to the test card via one or more intervening layers. Merely as an example, the test probes may be attached to a substrate. The substrate may be attached to a space transformer layer. The space transformer layer may be electrically coupled to and/or attached to the test card. In another example, there may be even more (or less) layers between the test probes and the test cards.

Figure 10:
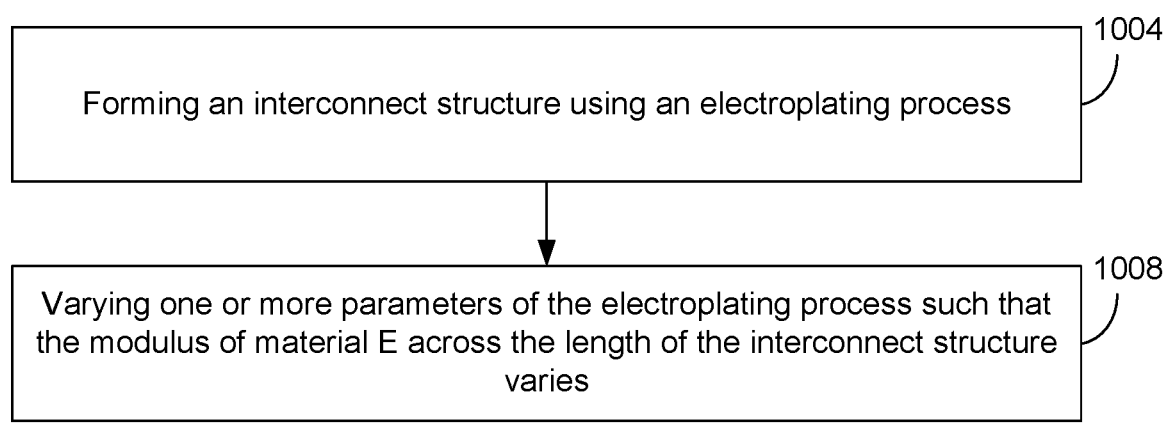
FIG. 10 is a flow diagram illustrating a method of forming the test probe discussed with respect to any of FIGS. 1-9D, according to some embodiments.

FIG. 10 is a flow diagram illustrating a method 1000 of forming the test probes discussed with respect to any of FIGS. 1-9D, according to some embodiments. Although the blocks in the flowchart with reference to FIG. 10 are shown in a particular order, the order of the actions can be modified. Thus, the illustrated embodiments can be performed in a different order, and some actions/blocks may be performed in parallel. Some of the blocks and/or operations listed in FIG. 10 may be optional in accordance with certain embodiments. The numbering of the blocks presented is for the sake of clarity and is not intended to prescribe an order of operations in which the various blocks must occur.

In some embodiments, the method 1000 comprises, at 1004, forming a test interconnect structure (e.g., the test probes discussed with respect to FIGS. 1-9D, comprising a member) using an electroplating process or an electrodeposition process. In some embodiments, the method 1000 comprises, at 1008, varying one or more parameters of the electroplating process such that the modulus of material E along the length of the interconnect structure (e.g., along the length of the member) varies. In an example, the one or more parameters of the electroplating process comprises plating current density, temperature, material used, etc., as discussed with respect to FIGS. 1-9D. In an example, the operations at 1008 may be performed while performing the operations at 1004.

In some embodiments, varying the one or more parameters of the electroplating process comprises varying one or both of: a current density associated with the electroplating process or a temperature of the electroplating process. In some embodiments, forming the interconnect structure comprises: forming a first section of the interconnect structure with a first one or more materials having a first value of the Young's modulus; and forming a second section of the interconnect structure with a second one or more materials having a second value of the Young's modulus.

Figure 11:
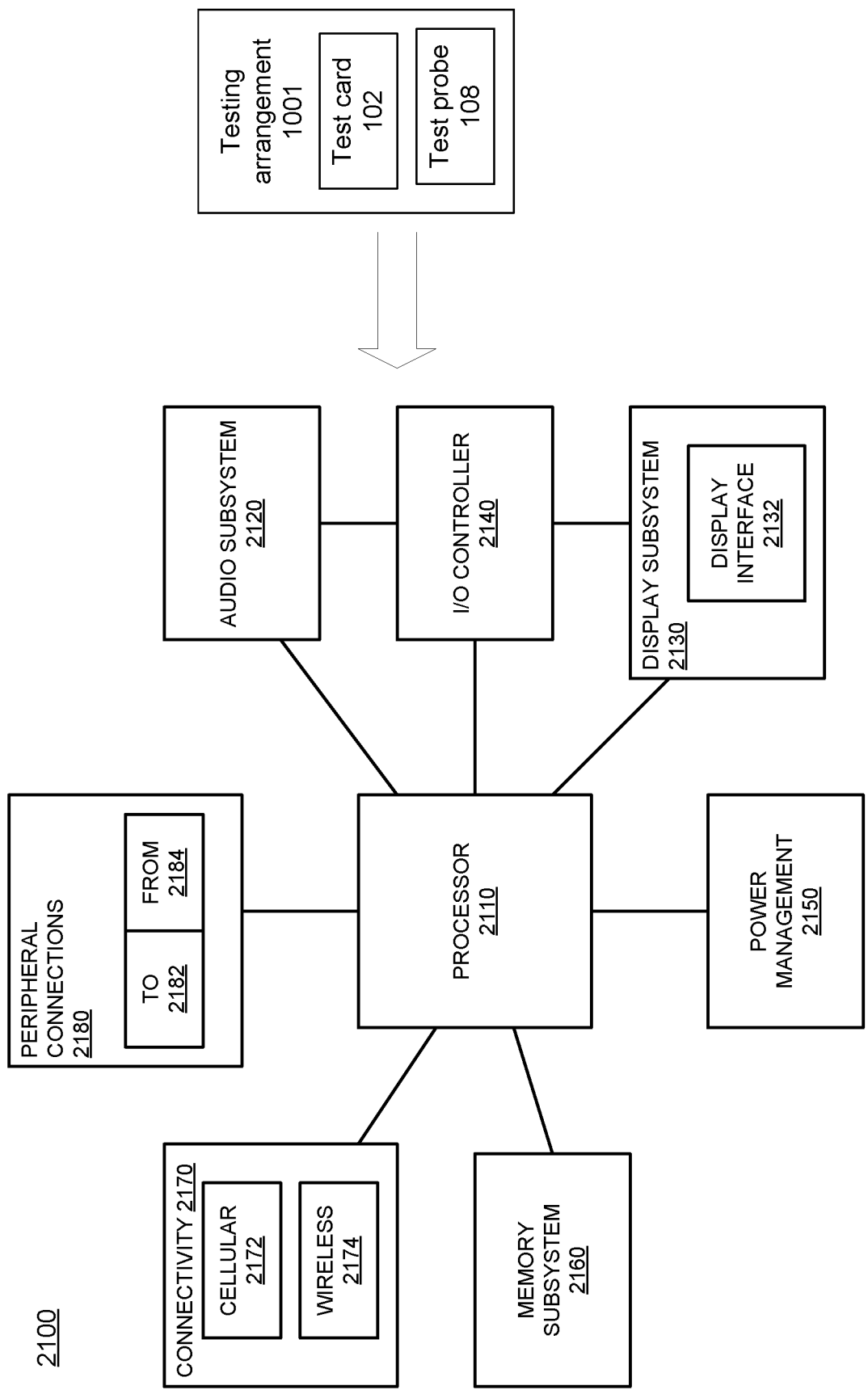
FIG. 11 illustrates a computing device or a SoC (System-on-Chip) comprising a testing arrangement that includes the test card and the test probe of any of FIGS. 1-9, according to some embodiments.

FIG. 11 illustrates a computing device or a SoC (System-on-Chip) 2100 comprising a testing arrangement 1001 that includes the test card 102 and the test probe 108, according to some embodiments. It is pointed out that those elements of FIG. 11 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may be used to test various DUTs, e.g., the DUT 110. For example, the computing device 2100 may include a testing arrangement 1001, which may include the test card 102 and the test probe 108. As discussed with respect to FIGS. 1-9, the test probe 108 may include a member 104 with varying modulus of material E.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Example 1

A first interconnect structure comprising: a member having a first end coupled to a test card, and a second end opposite the first end; and a contact tip at the second end of the member, the contact tip to removably attach to a second interconnect structure of a device under test, wherein a modulus of elasticity of the member varies along a length of the member.

Example 2

The first interconnect structure of example 1 or any other example, wherein: the member has a first section at the first end and a second section at the second end; and the first section of the member has a first modulus of elasticity that is different from a second modulus of elasticity of the second section of the member.

Example 3

The first interconnect structure of example 2 or any other example, wherein: the first modulus of elasticity is higher than the second modulus of elasticity.

Example 4

The first interconnect structure of example 2 or any other example, wherein: the member has a third section between the first section and the second section, and the third section of the member has a third modulus of elasticity that is different from the first modulus of elasticity or the second modulus of elasticity.

Example 5

The first interconnect structure of example 4 or any other example, wherein: the first modulus of elasticity is higher than the third modulus of elasticity; and the third modulus of elasticity is higher than the second modulus of elasticity.

Example 6

The first interconnect structure of example 1 or any other example, wherein: the member comprises one or more materials having a first crystallographic structure at the first end, and the one or more materials having a second crystallographic structure at the second end; and a modulus of elasticity of the one or more materials having the first crystallographic structure is different from a modulus of elasticity of the one or more materials having the second crystallographic structure.

Example 7

The first interconnect structure of example 1 or any other example, wherein: the member comprises a first one or more materials at a first section at the first end; the member comprises a second one or more materials at a second section at the first end; and the first one or more materials at the first section has a first modulus of elasticity that is higher than a second modulus of elasticity of the second one or more materials at the second section.

Example 8

The first interconnect structure of example 7 or any other example, wherein: the first one or more materials comprise one or both of Nickel or Copper; and the second one or more materials comprise one or both of Copper or Silver.

Example 9

The first interconnect structure of any of examples 1-8 or any other example, wherein: the contact tip is to deflect upon contact with the second interconnect structure of the device under test.

Example 10

The first interconnect structure of any of examples 1-8 or any other example, wherein: the modulus of elasticity of the member substantially monotonically reduces along the length of the member from the first end to the second end.

Example 11

The first interconnect structure of any of examples 1-8 or any other example, wherein: the member has a substantially tapered shape, wherein the tapered shape has a cross sectional diameter at the first end that is larger than a cross sectional diameter at the second end.

Example 12

A system comprising: a memory to store instructions; a processor coupled to the memory, the processor to execute the instructions to test a device under test (DUT); a test card to be removably attached to the DUT via a plurality of probes to test the DUT; and the plurality of probes, wherein a probe of the plurality of probes has a first end attached to the test card and a second end to be removably attached to an interconnect structure of the DUT, wherein a modulus of material of the probe substantially monotonically reduces from the first end to the second end.

Example 13

The system of example 12 or any other example, wherein: the probe comprises a first one or more materials at a first section of the probe; the member comprises a second one or more materials at a second section of the probe; and the first one or more materials at the first section has a first modulus of elasticity that is different from a second modulus of elasticity of the second one or more materials at the second section.

Example 14

The system of example 12 or any other example, wherein: the probe comprises first one or more material at the first end and second one or more material at the second end; and the first one or more material has a first value of the modulus of material that is higher than a second value of the modulus of material of the second one or more material.

Example 15

The system of example 12 or any other example, wherein: the probe has a substantially tapered shape; the first end of the probe has a first cross sectional diameter and a first modulus of material; the second end of the probe has a second cross sectional diameter and a second modulus of material; and the first cross sectional diameter is larger than the second cross sectional diameter, and the first modulus of material is higher than the second modulus of material.

Example 16

The system of any of examples 12-15 or any other example, wherein: the second end of the probe is to deflect upon contact with the interconnect structure of the DUT.

Example 17

A method comprising: forming an interconnect structure for testing a device under test, wherein forming the interconnect structure comprises: forming the interconnect structure such that a Young's modulus of the interconnect structure varies along a length of the interconnect structure.

Example 18

The method of example 17 or any other example, wherein forming the interconnect structure comprises: forming the interconnect structure with an electroplating process; and varying one or more parameters of the electroplating process such that the Young's modulus of the interconnect structure varies along the length of the interconnect structure.

Example 19

The method of example 18 or any other example, wherein varying the one or more parameters of the electroplating process comprises: varying one or both of: a current density associated with the electroplating process or a temperature of the electroplating process.

Example 20

The method of example 17 or any other example, wherein forming the interconnect structure comprises: forming a first section of the interconnect structure with a first one or more materials having a first value of the Young's modulus; and forming a second section of the interconnect structure with a second one or more materials having a second value of the Young's modulus.

Example 21

An apparatus comprising: means for performing the method of any of the examples 17-20 or any other example.

Example 22

An apparatus comprising: means for forming an interconnect structure for testing a device under test, wherein the means for forming the interconnect structure comprises: means for forming the interconnect structure such that a Young's modulus of the interconnect structure varies along a length of the interconnect structure.

Example 23

The apparatus of example 22 or any other example, wherein the means for forming the interconnect structure comprises: means for forming the interconnect structure with an electroplating process; and means for varying one or more parameters of the electroplating process such that the Young's modulus of the interconnect structure varies along the length of the interconnect structure.

Example 24

The apparatus of example 23 or any other example, wherein the means for varying the one or more parameters of the electroplating process comprises: means for varying one or both of: a current density associated with the electroplating process or a temperature of the electroplating process.

Example 25

The apparatus of example 22 or any other example, wherein the means for forming the interconnect structure comprises: means for forming a first section of the interconnect structure with a first one or more materials having a first value of the Young's modulus; and means for forming a second section of the interconnect structure with a second one or more materials having a second value of the Young's modulus.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A first interconnect structure comprising:
   a member having a first end coupled to a test card, and a second end opposite the first end; and
   a contact tip at the second end of the member, the contact tip to contact a second interconnect structure of a device under test,
   wherein a modulus of elasticity of the member varies along a length of the member between a first modulus of elasticity proximal to the first end and a second modulus of elasticity proximal to the second end, and wherein the first modulus of elasticity is greater than the second modulus of elasticity.

2. The first interconnect structure of claim 1, wherein:
   the member has a first section at the first end and a second section spaced apart from the first end by at least the first section; and
   the first section of the member has the first modulus of elasticity and the second section of the member has the second modulus of elasticity.

3. The first interconnect structure of claim 2, wherein:
   the member has a third section between the first section and the second section, and
   the third section of the member has a third modulus of elasticity that is smaller than the first modulus of elasticity and larger than the second modulus of elasticity.

4. The first interconnect structure of claim 3, wherein the first section, second section, and third section have substantially the same composition.

5. The first interconnect structure of claim 1, wherein:
   the member comprises one or more materials having a first crystallographic structure at the first end, and the one or more materials having a second crystallographic structure at the second end; and the one or more materials having the first crystallographic structure have the first modulus of elasticity, and the one or more materials having the second crystallographic structure have the second modulus of elasticity.

6. The first interconnect structure of claim 1, wherein:
the first section has a first material composition; and
the second section has a second material composition.

7. The first interconnect structure of claim 6, wherein:
the first section comprises one or both of Nickel or Copper; and
the second section comprises one or both of Copper or Silver.

8. The first interconnect structure of claim 1, wherein:
the contact tip is to deflect upon contact with the second interconnect structure of the device under test.

9. The first interconnect structure of claim 1, wherein:
the modulus of elasticity of the member monotonically declines along the length of the member with greater distance from the first end.

10. The first interconnect structure of claim 1, wherein:
the member has a cross sectional diameter at the first end that is larger than a cross sectional diameter at the second end.

11. A system comprising:
a memory to store instructions;
a processor coupled to the memory, the processor to execute the instructions to test a device under test (DUT); and
a test card to be removably coupled to the DUT via a plurality of probes to test the DUT, wherein a probe of the plurality of probes has a first end coupled to the test card and a second end to make contact with an interconnect structure of the DUT,
wherein a modulus of elasticity of the probe monotonically decreases with greater distance from the first end.

12. The system of claim 11, wherein:
the probe comprises a first material at a first section of the probe proximal to the first end;
the probe comprises a second material at a second section of the probe spaced apart from the first end by at least the first section; and
the first material has a first modulus of elasticity that is greater than a second modulus of elasticity of the second material.

13. The system of claim 11, wherein:
the first end of the probe has a first cross sectional diameter and the first modulus of elasticity;
the second end of the probe has a second cross sectional diameter and the second modulus of elasticity; and
the first cross sectional diameter is larger than the second cross sectional diameter.

14. The system of claim 11, wherein:
the second end of the probe is to deflect upon contact with the interconnect structure of the DUT.

15. A method of forming a probe structure for testing a device under test,
the method comprising
depositing probe material while varying deposition parameters over a duration of the depositing to modulate Young's modulus of the probe material over a thickness of the probe material from a higher modulus value at a first end coupled to a test card, to lower modulus value at a second end, distal from the test card.

16. The method of claim 15, wherein the method comprises:
depositing the probe material with an electroplating process; and
varying one or more parameters of the electroplating process.

17. The method of claim 16, wherein varying the one or more parameters of the electroplating process comprises:
varying one or both of: a current density associated with the electroplating process or a temperature of the electroplating process.

18. The method of claim 15, wherein the method comprises:
depositing a first material having a first, higher, value of Young's modulus; and
depositing a second material having a second, lower, value of Young's modulus.

* * * * *